(12) United States Patent  (10) Patent No.: US 8,969,963 B2
Basker et al.  (45) Date of Patent: Mar. 3, 2015

(54) VERTICAL SOURCE/DRAIN JUNCTIONS FOR A FINFET INCLUDING A PLURALITY OF FINS

(71) Applicant: International Business Machines Corporation, Armonk, NY (US)

(72) Inventors: Veeraraghavan S. Basker, Schenectady, NY (US); Effendi Leobandung, Wappingers Falls, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 13/650,176

(22) Filed: Oct. 12, 2012

(65) Prior Publication Data

US 2014/0103435 A1  Apr. 17, 2014

(51) Int. Cl.
  *H01L 29/78*  (2006.01)
  *H01L 21/336*  (2006.01)

(52) U.S. Cl.
  USPC ........................................................ 257/347

(58) Field of Classification Search
  CPC ............ H01L 29/66795; H01L 29/785; H01L 29/7851; H01L 29/41791; H01L 2029/7858
  USPC .......... 438/283, 157, 197; 257/347, 365, 288, 257/401
  See application file for complete search history.

(56) References Cited

U.S. PATENT DOCUMENTS

| | | | |
|---|---|---|---|
| 6,716,686 B1 | 4/2004 | Buynoski et al. | |
| 7,432,557 B1 | 10/2008 | Buynoski et al. | |
| 7,470,578 B2 | 12/2008 | Nowak et al. | |
| 7,923,337 B2 | 4/2011 | Chang et al. | |
| 2010/0038679 A1* | 2/2010 | Chan et al. | 257/190 |
| 2010/0270627 A1* | 10/2010 | Chang et al. | 257/411 |
| 2011/0143529 A1* | 6/2011 | Lee et al. | 438/591 |
| 2012/0012932 A1 | 1/2012 | Perng et al. | |
| 2012/0091538 A1 | 4/2012 | Lin et al. | |
| 2012/0193713 A1 | 8/2012 | Kulkarni et al. | |

* cited by examiner

*Primary Examiner* — Whitney T Moore
(74) *Attorney, Agent, or Firm* — Scully, Scott, Murphy & Presser, P.C.; Joseph P. Abate, Esq.

(57) ABSTRACT

Fin-defining mask structures are formed over a semiconductor material layer. A semiconductor material portion is formed by patterning the semiconductor material layer, and a disposable gate structure is formed over the fin-defining mask structures. After formation of a disposable template layer, the disposable gate structure is removed. A plurality of semiconductor fins are formed by etching center portions of the semiconductor material portion employing the combination of the disposable template layer and the fin-defining mask structures as an etch mask. A first pad region and a second pad region laterally contact the plurality of semiconductor fins. A replacement gate structure is formed on the plurality of semiconductor fins. The disposable template layer is removed, and the first pad region and the second pad regions are vertically recessed. Vertical source/drain junctions can be formed by introducing dopants through vertical sidewalls of the recessed source and second pad regions.

16 Claims, 16 Drawing Sheets

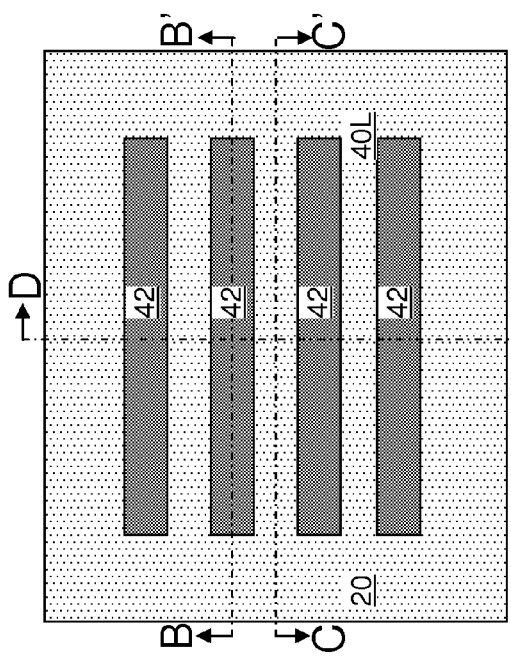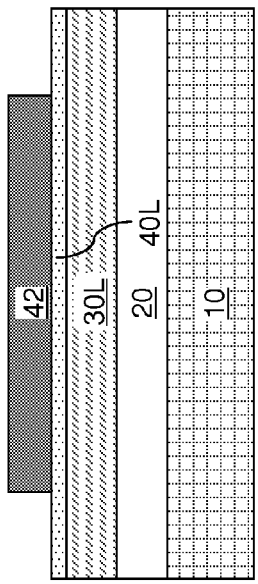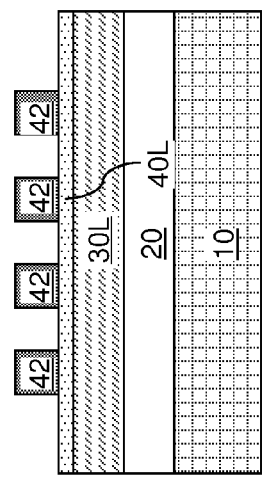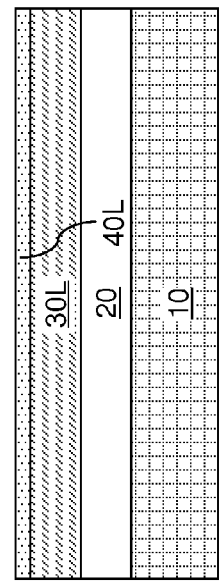

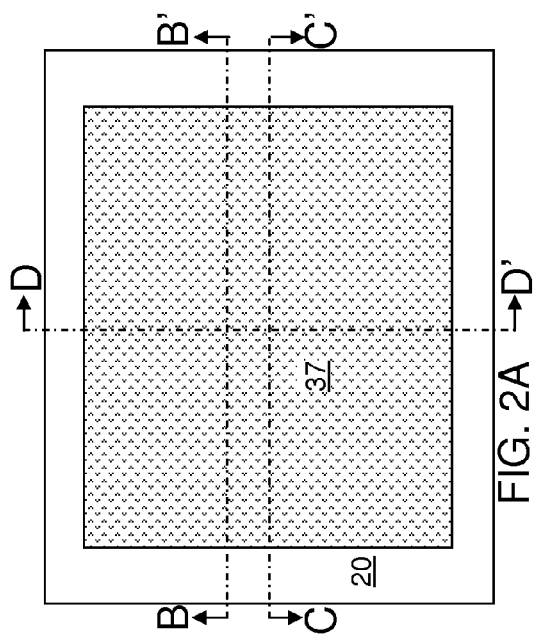
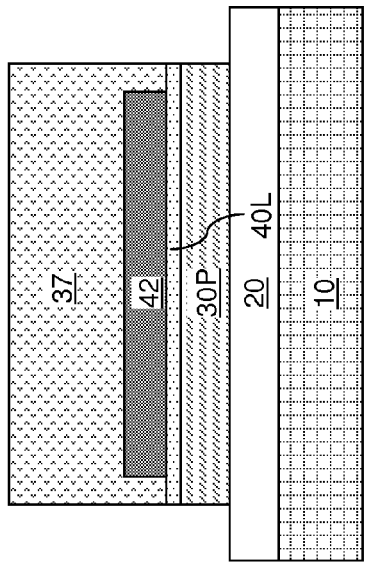
FIG. 2B
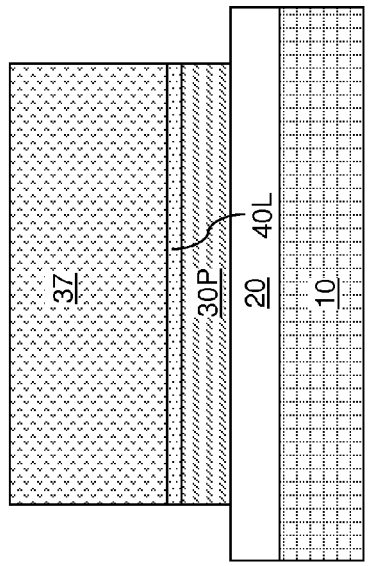
FIG. 2C
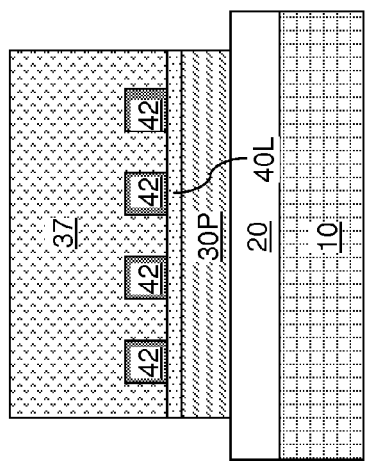
FIG. 2D

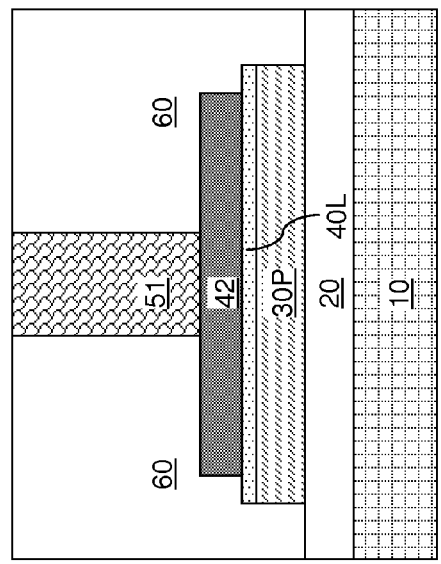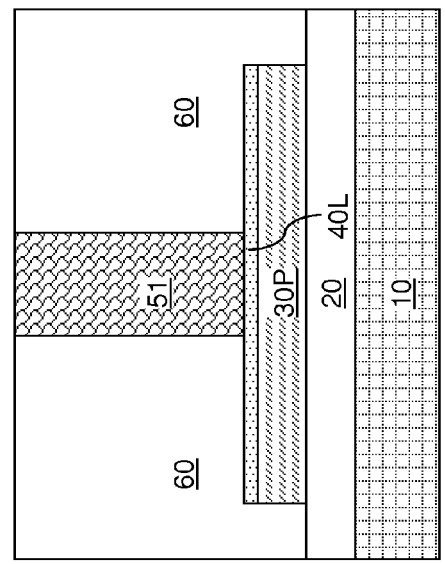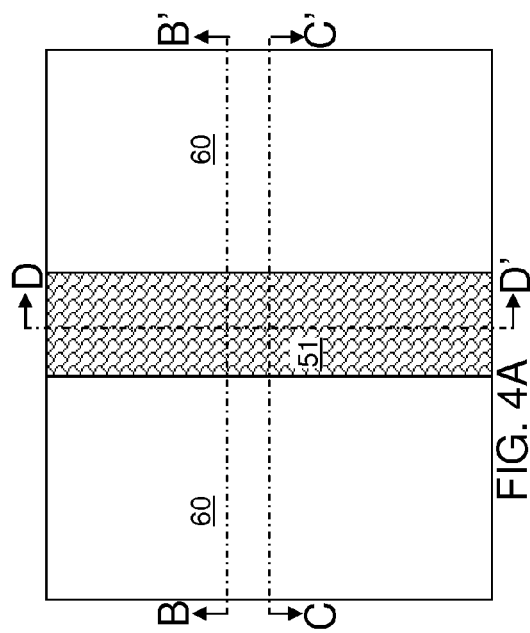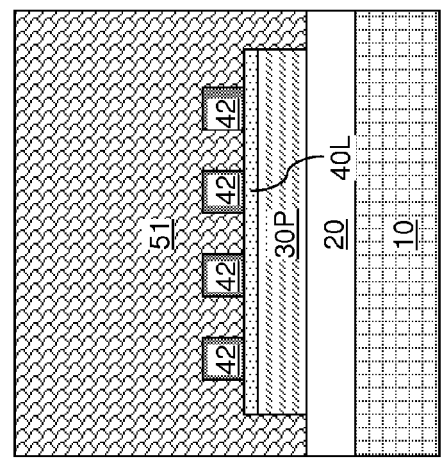

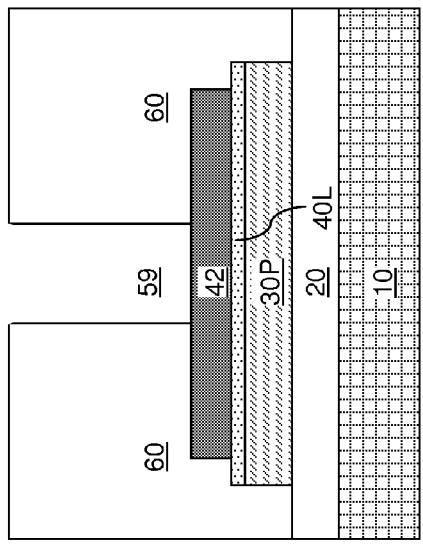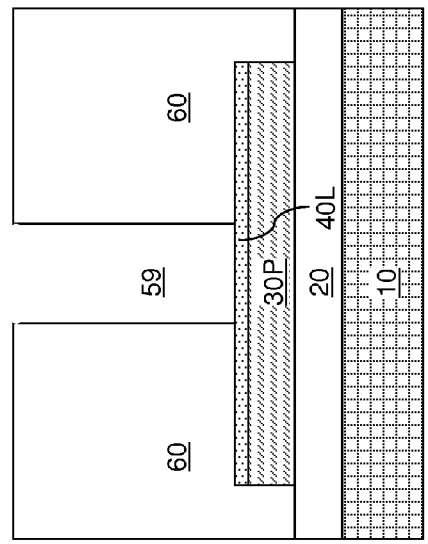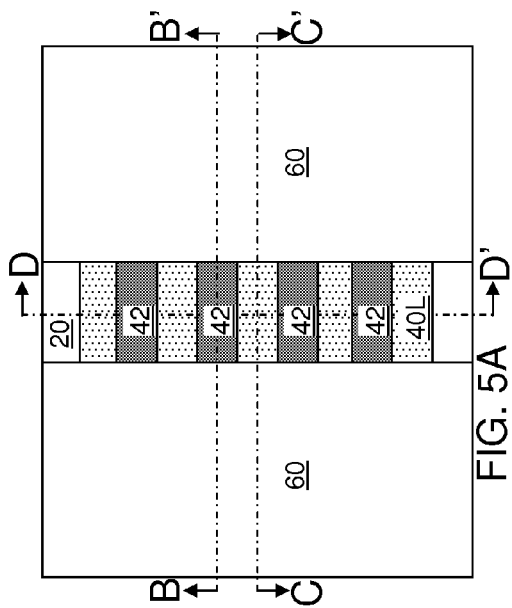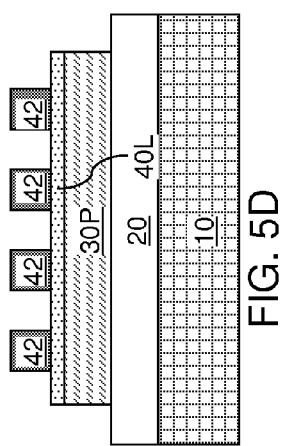

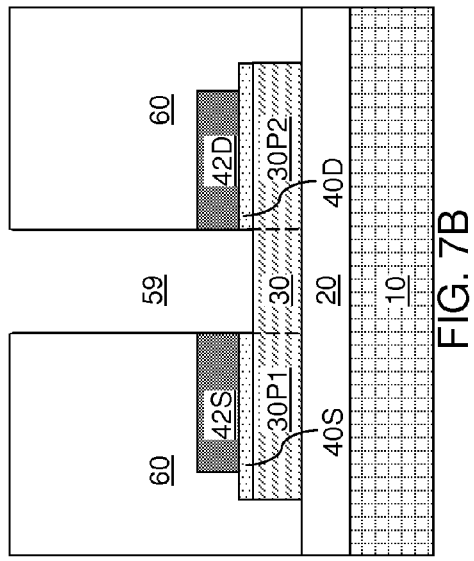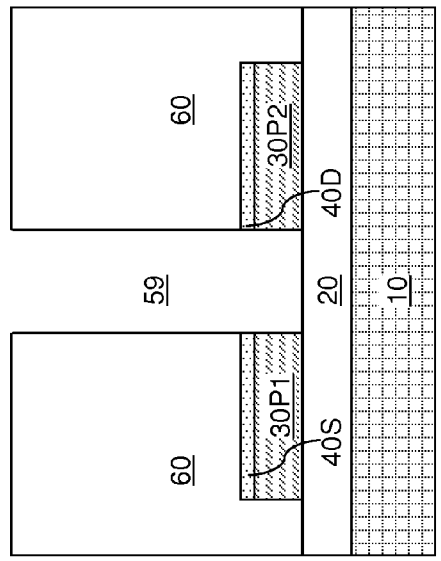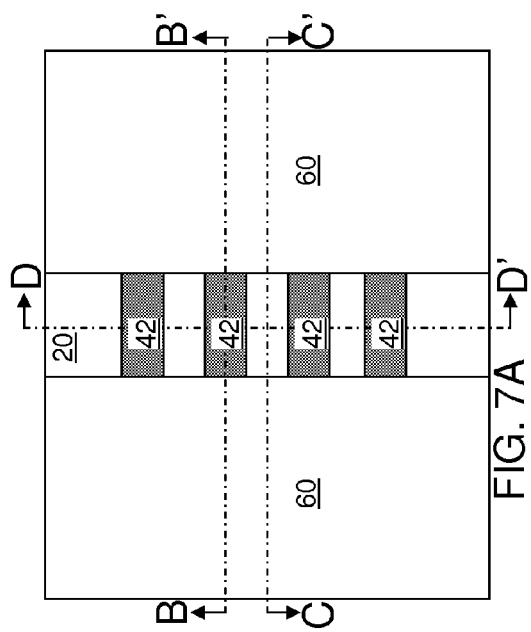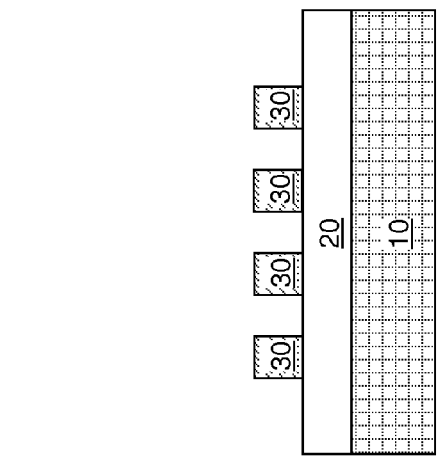

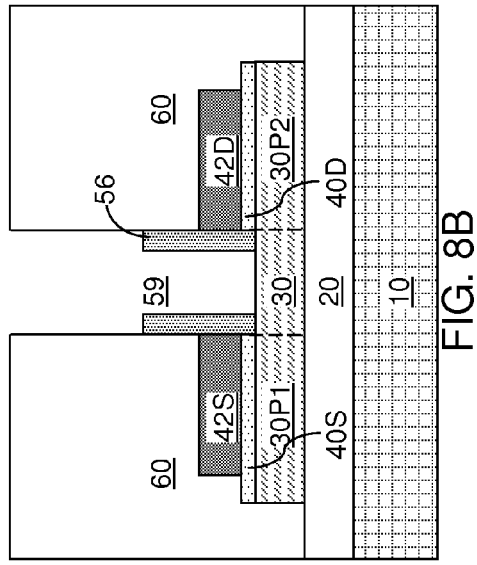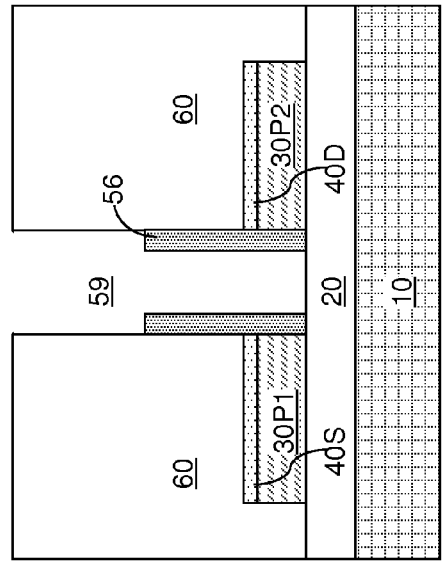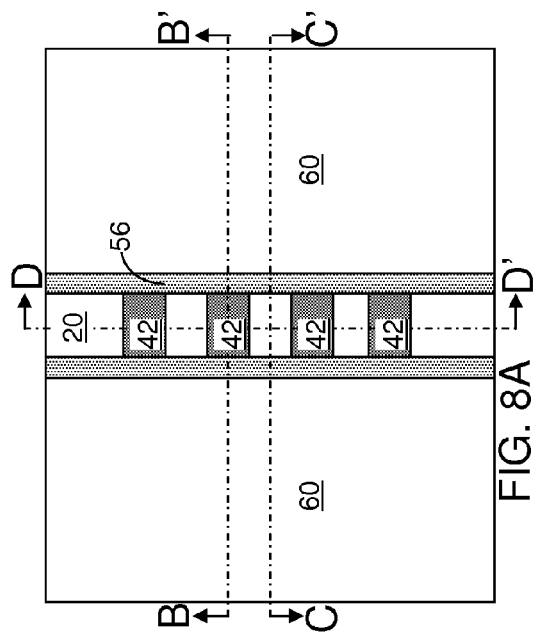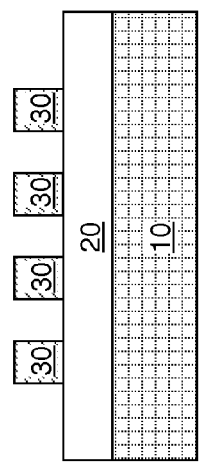

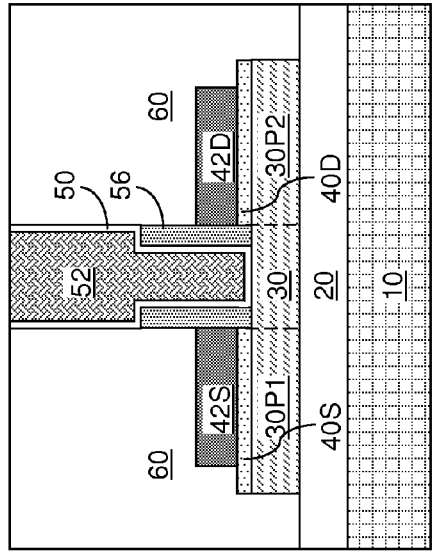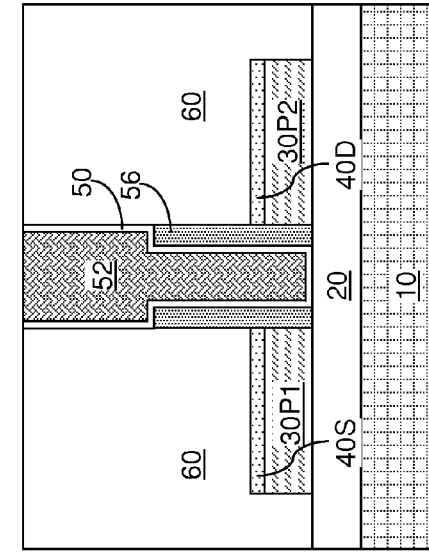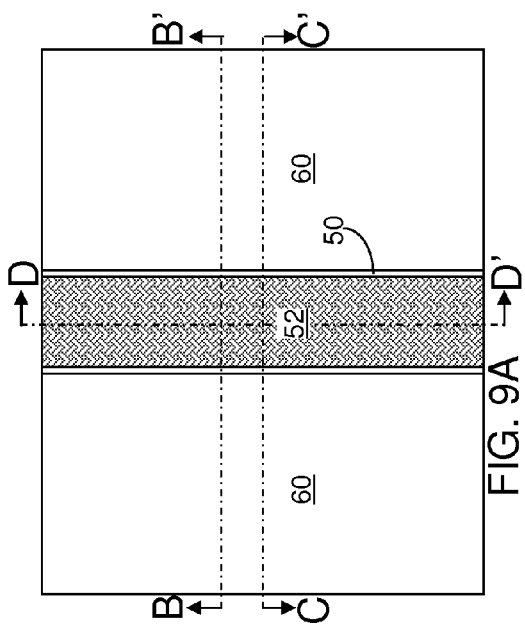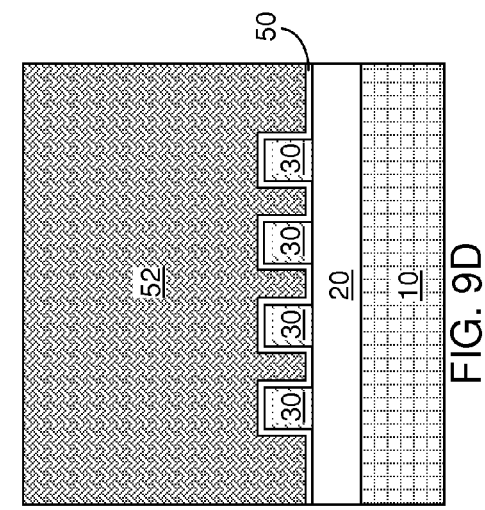

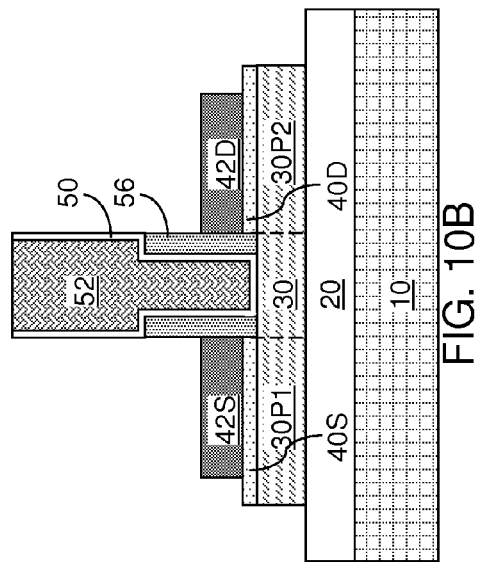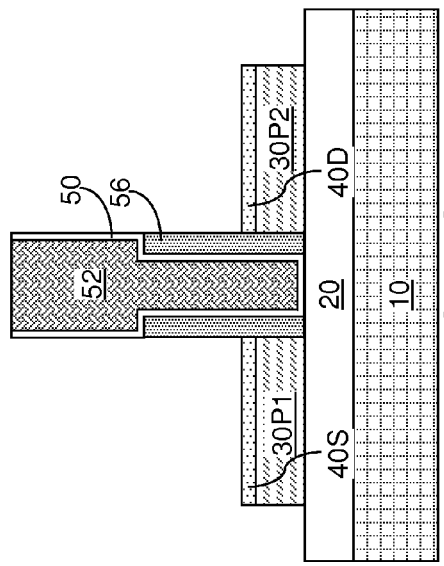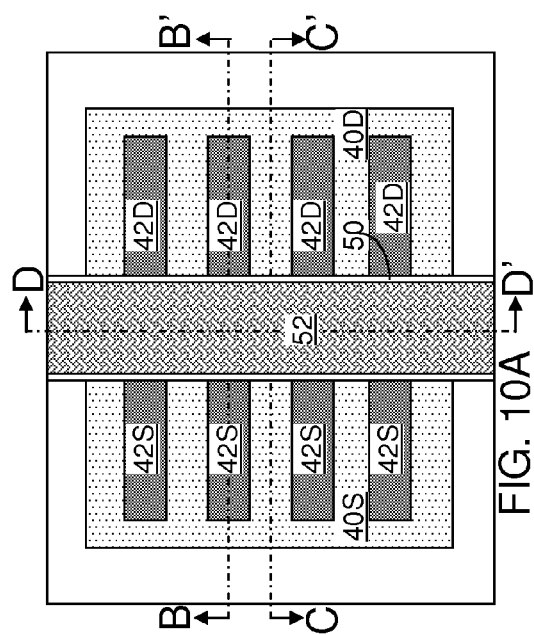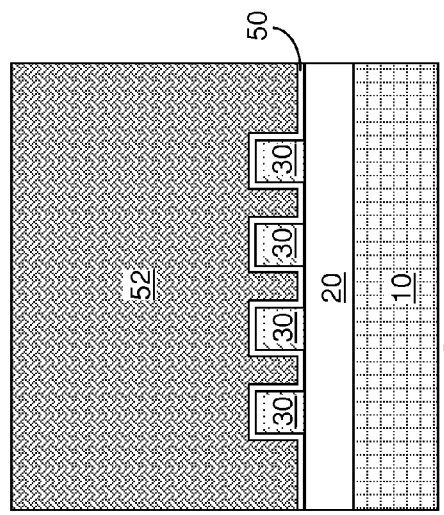

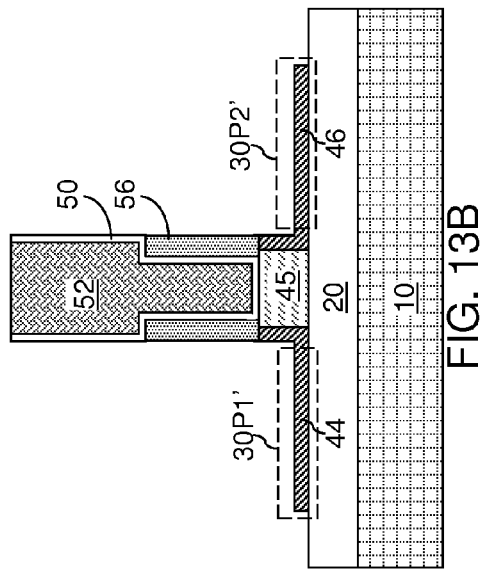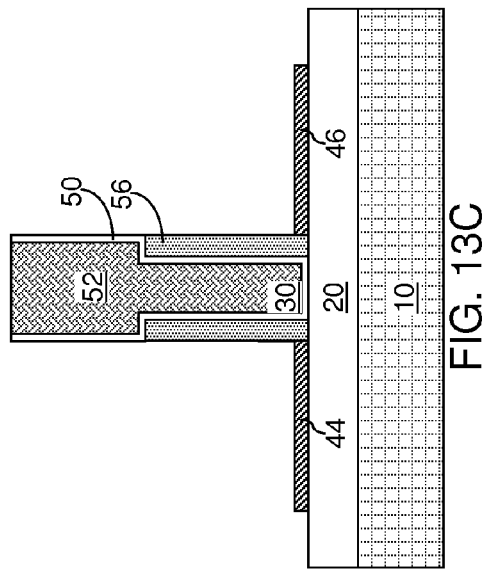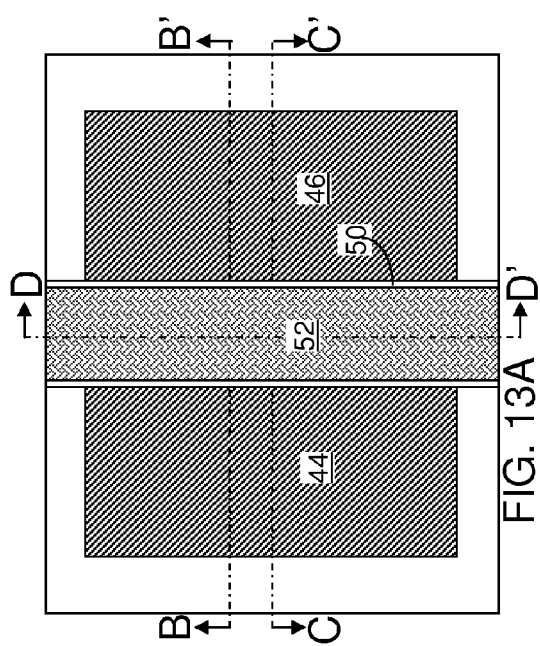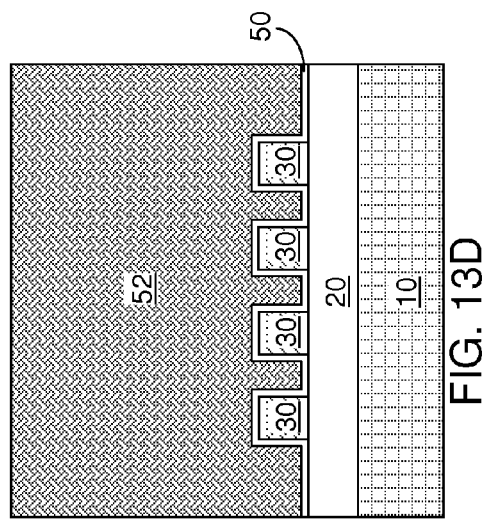

VERTICAL SOURCE/DRAIN JUNCTIONS FOR A FINFET INCLUDING A PLURALITY OF FINS

BACKGROUND

The present disclosure relates to a semiconductor structure, and particularly to a finFET transistor including vertical source/drain junctions, and a method of manufacturing the same.

Fin field effect transistors can increase the on-current per unit area relative to planar field effect transistors. One type of fin field effect transistors employs a first pad and a second pad that are connected to a plurality of semiconductor fins. The lateral dimensions of the first pad and the second pad along a horizontal direction perpendicular to the direction of the channels in the semiconductor fins is typically greater than the diffusion length of dopants introduced into the first pad and the second pad. For this reason, dopants cannot be effectively implanted through sidewalls of the first pad and the second pad. Instead, dopants are introduced by ion implantation through the top surfaces of the first pad and the second pad.

The variation in the density of implanted dopants with depth from the top surfaces of the first pad and the second pad introduces a vertical dopant concentration gradient in the first pad and the second pad. Further, the vertical dopant concentration gradient causes formation of non-vertical source/drain junctions, and therefore, induces variations in the channel length as a function of depth. For example, the length of the channel at a depth at which the dopant concentration of implanted dopants is at a maximum is shorter than the length of the channel at another depth at which the dopant concentration of implanted dopants is at a value less than the maximum. The channel length variations caused by the non-uniformity of the channel length as a function of depth degrades performance of the fin field effect transistor through a poorly defined turn-on voltage for the fin field effect transistor.

SUMMARY

Fin-defining mask structures are formed over a semiconductor material layer. A semiconductor material portion is formed by patterning the semiconductor material layer, and a disposable gate structure is formed over the fin-defining mask structures. After formation of a disposable template layer, the disposable gate structure is removed. A plurality of semiconductor fins are formed by etching center portions of the semiconductor material portion employing the combination of the disposable template layer and the fin-defining mask structures as an etch mask. A first pad region and a second pad region laterally contact the plurality of semiconductor fins. A replacement gate structure is formed on the plurality of semiconductor fins. The disposable template layer is removed, and the first pad region and the second pad regions are vertically recessed. Vertical source/drain junctions can be formed by introducing dopants through vertical sidewalls of the recessed source and second pad regions.

According to an aspect of the present disclosure, a semiconductor structure including a contiguous semiconductor portion located on an insulator layer is provided. The contiguous semiconductor portion includes a first pad portion, a second pad portion spaced from the first pad portion, and a plurality of semiconductor fins connecting the first pad portion and the second pad portion. A source region includes the first pad portion and first end portions of the plurality of semiconductor fins, and a drain region includes the second pad portion and second end portions of the plurality of semiconductor fins. A top surface of the first pad portion and a top surface of the second pad portion are recessed relative to top surfaces of the plurality of semiconductor fins. Source junctions between the source region and body regions within the plurality of semiconductor fins are vertical, and drain junctions between the drain region and the body regions are vertical.

According to another aspect of the present disclosure, a method of forming a semiconductor structure is provided. A contiguous semiconductor portion is formed on an insulator layer. The contiguous semiconductor portion has a same thickness throughout and includes a first pad portion, a second pad portion laterally spaced from the first pad portion, and a plurality of semiconductor fins connecting the first pad portion and the second pad portion. A gate stack including a gate dielectric and a gate electrode is formed over the plurality of semiconductor fins. The first pad portion and the second pad portion are recessed below horizontal top surfaces of the plurality of semiconductor fins employing the gate stack as an etch mask. Electrical dopants are introduced into the first pad portion, the second pad portion, and end portions of the plurality of semiconductor fins to form a source region and a drain region.

BRIEF DESCRIPTION OF SEVERAL VIEWS OF THE DRAWINGS

FIG. 1A is a top-down view of an exemplary semiconductor structure after formation of a plurality of fin-defining mask structures according to an embodiment of the present disclosure.

FIG. 1B is a vertical cross-sectional view of the exemplary semiconductor structure along the vertical plane B-B' of FIG. 1A.

FIG. 1C is a vertical cross-sectional view of the exemplary semiconductor structure along the vertical plane C-C' of FIG. 1A.

FIG. 1D is a vertical cross-sectional view of the exemplary semiconductor structure along the vertical plane D-D' of FIG. 1A.

FIG. 2A is a top-down view of the exemplary semiconductor structure after formation of a semiconductor material portion by patterning a semiconductor material layer according to an embodiment of the present disclosure.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane C-C' of FIG. 2A.

FIG. 2D is a vertical cross-sectional view of the exemplary semiconductor structure along the vertical plane D-D' of FIG. 2A.

FIG. 4A is a top-down view of the exemplary semiconductor structure after formation of a disposable template layer according to an embodiment of the present disclosure.

FIG. 4B is a vertical cross-sectional view of the exemplary semiconductor structure along the vertical plane B-B' of FIG. 4A.

FIG. 4C is a vertical cross-sectional view of the exemplary semiconductor structure along the vertical plane C-C' of FIG. 4A.

FIG. 4D is a vertical cross-sectional view of the exemplary semiconductor structure along the vertical plane D-D' of FIG. 4A.

FIG. 5A is a top-down view of the exemplary semiconductor structure after formation of a gate cavity according to an embodiment of the present disclosure.

FIG. 5B is a vertical cross-sectional view of the exemplary semiconductor structure along the vertical plane B-B' of FIG. 5A.

FIG. 5C is a vertical cross-sectional view of the exemplary semiconductor structure along the vertical plane C-C' of FIG. 5A.

FIG. 5D is a vertical cross-sectional view of the exemplary semiconductor structure along the vertical plane D-D' of FIG. 5A.

FIG. 7A is a top-down view of the exemplary semiconductor structure after optional removal of physically exposed portions of the plurality of fin-defining mask structures according to an embodiment of the present disclosure.

FIG. 7B is a vertical cross-sectional view of the exemplary semiconductor structure along the vertical plane B-B' of FIG. 7A.

FIG. 7C is a vertical cross-sectional view of the exemplary semiconductor structure along the vertical plane C-C' of FIG. 7A.

FIG. 7D is a vertical cross-sectional view of the exemplary semiconductor structure along the vertical plane D-D' of FIG. 7A.

FIG. 8A is a top-down view of the exemplary semiconductor structure after formation of a gate spacer according to an embodiment of the present disclosure.

FIG. 8B is a vertical cross-sectional view of the exemplary semiconductor structure along the vertical plane B-B' of FIG. 8A.

FIG. 8C is a vertical cross-sectional view of the exemplary semiconductor structure along the vertical plane C-C' of FIG. 8A.

FIG. 8D is a vertical cross-sectional view of the exemplary semiconductor structure along the vertical plane D-D' of FIG. 8A.

FIG. 9A is a top-down view of the exemplary semiconductor structure after formation of a replacement gate structure according to an embodiment of the present disclosure.

FIG. 9B is a vertical cross-sectional view of the exemplary semiconductor structure along the vertical plane B-B' of FIG. 9A.

FIG. 9C is a vertical cross-sectional view of the exemplary semiconductor structure along the vertical plane C-C' of FIG. 9A.

FIG. 9D is a vertical cross-sectional view of the exemplary semiconductor structure along the vertical plane D-D' of FIG. 9A.

FIG. 10A is a top-down view of the exemplary semiconductor structure after removal of the disposable template layer according to an embodiment of the present disclosure.

FIG. 10B is a vertical cross-sectional view of the exemplary semiconductor structure along the vertical plane B-B' of FIG. 10A.

FIG. 10C is a vertical cross-sectional view of the exemplary semiconductor structure along the vertical plane C-C' of FIG. 10A.

FIG. 10D is a vertical cross-sectional view of the exemplary semiconductor structure along the vertical plane D-D' of FIG. 10A.

FIG. 13A is a top-down view of the exemplary semiconductor structure after formation of a source region and a drain region according to an embodiment of the present disclosure.

FIG. 13B is a vertical cross-sectional view of the exemplary semiconductor structure along the vertical plane B-B' of FIG. 13A.

FIG. 13C is a vertical cross-sectional view of the exemplary semiconductor structure along the vertical plane C-C' of FIG. 13A.

FIG. 13D is a vertical cross-sectional view of the exemplary semiconductor structure along the vertical plane D-D' of FIG. 13A.

DETAILED DESCRIPTION

Figure 3A:
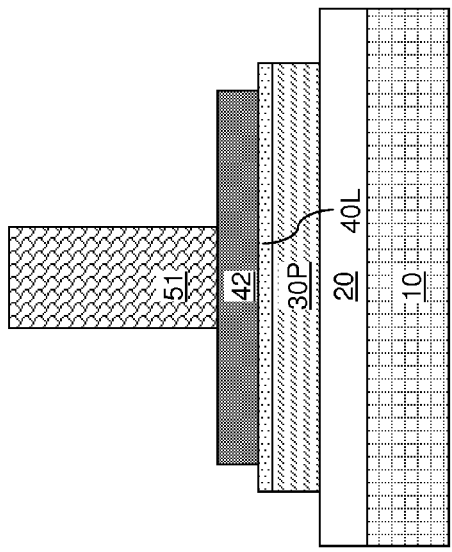
FIG. 3A is a top-down view of the exemplary semiconductor structure after formation of a disposable gate structure according to an embodiment of the present disclosure.

As stated above, the present disclosure relates to a finFET transistor including vertical source/drain junctions, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A, 1B, 1C, and 1D, an exemplary semiconductor structure according to an embodiment of the present disclosure includes a semiconductor-on-insulator (SOI) substrate. The SOI substrate can include a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a semiconductor material. The semiconductor material can be an elemental semiconductor material or a compound semiconductor material. For example, the semiconductor material can be silicon, germanium, a silicon-germanium alloy, or a silicon-carbon alloy. The semiconductor material may or may not be doped with p-type dopants and/or n-type dopants. The semiconductor material can be a single crystalline semiconductor material, a polycrystalline semiconductor material, or an amorphous semiconductor material. In one embodiment, the semiconductor material can be silicon. In one embodiment, the semiconductor material can be single crystalline silicon. The thickness of the top semiconductor layer 30L can be from 10 nm to 500 nm, although lesser and greater thicknesses can be employed.

An optional dielectric pad layer 40L can be formed on the top surface of the top semiconductor layer 30L. The optional dielectric pad layer 40L includes a dielectric material, which can be, for example, silicon oxide, silicon oxynitride, a dielectric metal oxide, or a combination thereof. The optional dielectric pad layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the optional dielectric pad layer 40L can be from 1 nm to 20 nm, although lesser and greater thicknesses can also be employed.

A plurality of fin-defining mask structures 42 can be formed over the top semiconductor layer 30L. The plurality of fin-defining mask structures 42 can be formed directly on the optional dielectric pad layer 40L, if present. The plurality of fin-defining mask structures 42 are mask structures that cover the regions of the top semiconductor layer 30L that are subsequently converted into semiconductor fins. Thus, the plurality of fin-defining mask structures 42 are subsequently employed to define the area of the semiconductor fins. The plurality of fin-defining mask structures 42 can include a dielectric material such as silicon nitride, silicon oxide, and silicon oxynitride.

The plurality of fin-defining mask structures 42 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 42. In one embodiment, each fin-defining mask structure 42 in the plurality of fin-defining mask structures 42 can laterally extend along a lengthwise direction (e.g., the horizontal direction within the B-B' plane or the C-C' plane). Further, each fin-defining mask structure 42 in the plurality of fin-defining mask structures 42 can have a pair of sidewalls that are separated along a widthwise direction, which is perpendicular to the lengthwise direction. In one embodiment, each fin-defining mask structure 42 in the plurality of fin-defining mask structures 42 can have a rectangular horizontal cross-sectional area. In one embodiment, the fin-defining mask structures 42 in the plurality of fin-defining mask structures 42 can have the same width w.

Referring to FIGS. 2A, 2B, 2C, and 2D, a photoresist layer 37 can be applied over the plurality of fin-defining mask structures 42. The photoresist layer 37 can subsequently be patterned to cover an area overlying a portion or the entirety of the plurality of fin-defining mask structures 42.

Any portions of the fin-defining mask structures which lie outside the photoresist layer 37 may be removed, and the pattern in the photoresist layer 37 is transferred into the optional dielectric pad layer 40L and the top semiconductor layer 30L by an etch. The etch can be an anisotropic etch or an isotropic etch. In one embodiment, the etch can be a reactive ion etch, which is an anisotropic etch. In one embodiment, the etch can be selective to the dielectric material of the buried insulator layer 20. A remaining portion of the top semiconductor layer 30L after the pattern transfer from the photoresist layer 37 through the top semiconductor layer 30L is herein referred to as a semiconductor material portion 30P. The photoresist layer 37 is removed, for example, by ashing.

Figure 3B:
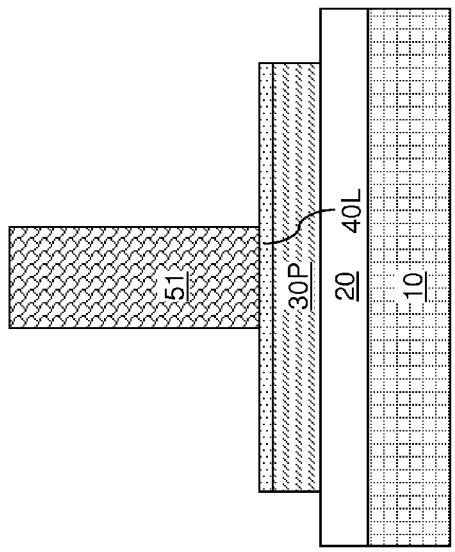
FIG. 3B is a vertical cross-sectional view of the exemplary semiconductor structure along the vertical plane B-B' of FIG. 3A.
Figure 3D:
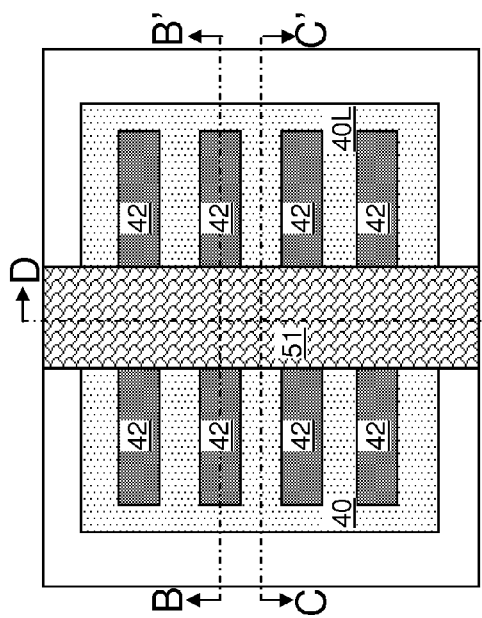
FIG. 3D is a vertical cross-sectional view of the exemplary semiconductor structure along the vertical plane D-D' of FIG. 3A.
Figure 3C:
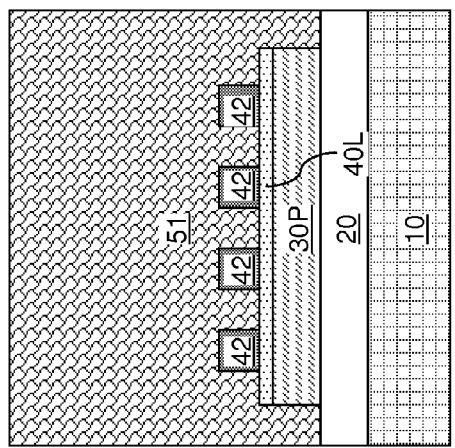
FIG. 3C is a vertical cross-sectional view of the exemplary semiconductor structure along the vertical plane C-C' of FIG. 3A.

Referring to FIGS. 3A, 3B, 3C, and 3D, a disposable gate structure 51 can be formed, for example, by first depositing a disposable gate material layer (not shown). Thereafter, the deposited disposable gate material layer can be lithographically patterned. A remaining portion of the disposable gate material layer after the lithographic patterning constitutes the disposable gate structure 51.

The disposable gate material layer includes a material that can be removed selective to the material of the plurality of fin-defining mask structures 42 and selective to material of the optional dielectric pad layer 40L if the optional dielectric pad layer 40L is present. In this case, the disposable gate material layer can include a semiconductor material, a dielectric material that is different from the dielectric material of the optional dielectric cap pad layer 40L, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed.

The disposable gate material layer includes a material that can be removed selective to the material of the plurality of fin-defining mask structures 42 and selective to the material of the semiconductor material portion 30P if the optional dielectric pad layer 40L is not present. In this case, the disposable gate material layer can include a semiconductor material that is different from the semiconductor material of the semiconductor material portion 30P, a dielectric material, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed. In one embodiment, the semiconductor material of the semiconductor material portion 30P can be silicon, and the material of the disposable gate material layer can be germanium, a silicon germanium alloy, undoped silicon oxide, doped silicon oxide, or a combination thereof.

A photoresist layer (not shown) can be applied over the disposable gate material. The photoresist layer can be subsequently patterned into gate patterns, which can include a line which runs perpendicular to and intersect the plurality of fin-defining mask structures 42. Physically exposed portions of the disposable gate material layer, i.e., portions of the disposable gate material layer that are not covered by the patterned photoresist layer, are removed, for example, by an etch, which can be an anisotropic etch. The etch that removes physically exposed portions of the disposable gate material layer can be selective to the materials of the plurality of fin-defining mask structures 42. If the optional dielectric pad layer 40L is present, the etch that removes physically exposed portions of the disposable gate material layer can be selective to the materials of the optional dielectric pad layer 40. If the optional dielectric pad layer 40L is not present, the etch that removes physically exposed portions of the disposable gate material layer can be selective to the semiconductor material of the semiconductor material portion 30P. The disposable gate structure 51 straddles over middle portions of the plurality of fin-defining mask structures 42.

Referring to FIGS. 4A, 4B, 4C, and 4D, a disposable fill material can be deposited over the disposable gate structure 51 and the semiconductor material portion 30P to form a disposable template layer 60. The disposable template layer 60 includes at least one dielectric material, which can be silicon oxide, silicon nitride, silicon oxynitride, organosilicate glass (OSG), or a combination thereof. In one embodiment, the thickness of the deposited disposable fill material can be selected so that the lowest portion of the top surface of the deposited disposable fill material can be formed above the top surface of the disposable gate structure 51.

The disposable template layer 60 can be subsequently planarized, for example, by chemical mechanical planarization (CMP). In one embodiment, the disposable gate structure 51 can be employed as a stopping layer during the CMP. A top surface of the disposable gate structure 51 is physically exposed. The top surface of the disposable template layer 60 can be a planar surface that is coplanar with the physically exposed top surface of the disposable gate structure 51.

Referring to FIGS. 5A, 5B, 5C, and 5D, the disposable gate structure 51 is removed selective to the disposable fill material of the disposable template layer 60 and selective to the plurality of fin-defining mask structures 42. If the optional dielectric pad 40 is present, the disposable gate structure 51 can be removed selective to material of the optional dielectric pad 40. If the optional dielectric pad 40 is not present, the disposable gate structure 51 can be removed selective to the semiconductor material of the semiconductor material portion 30P and selective to the plurality of fin-defining mask structures 42. A gate cavity 59 is formed within a volume from which the disposable gate structure 51 is removed. The disposable template layer 60 becomes a cavity-including disposable template layer, i.e., a disposable template layer that includes a cavity, upon formation of the gate cavity 59.

Figure 6A:
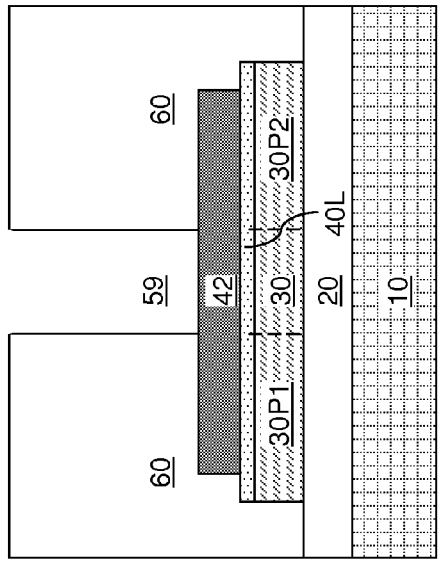
FIG. 6A is a top-down view of the exemplary semiconductor structure after formation of a plurality of semiconductor fins by an etch that employs the combination of the plurality of fin-defining mask structures and said disposable template layer as an etch mask according to an embodiment of the present disclosure.
Figure 6B:
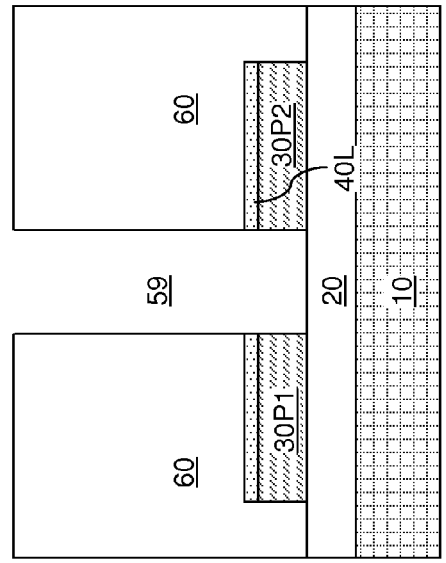
FIG. 6B is a vertical cross-sectional view of the exemplary semiconductor structure along the vertical plane B-B' of FIG. 6A.
Figure 6C:
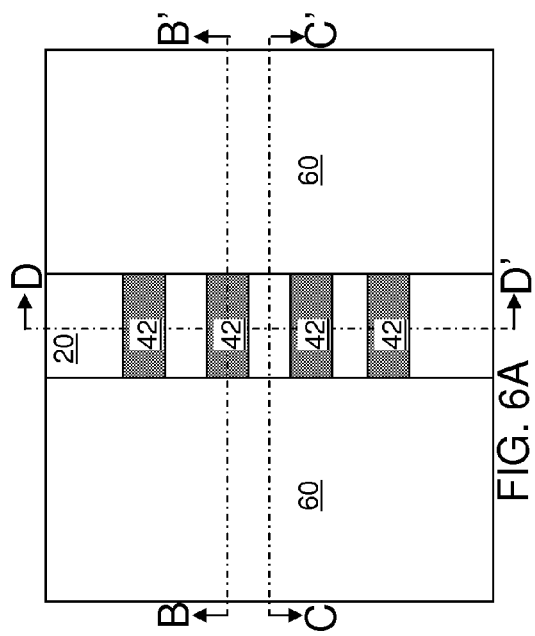
FIG. 6C is a vertical cross-sectional view of the exemplary semiconductor structure along the vertical plane C-C' of FIG. 6A.
Figure 6D:
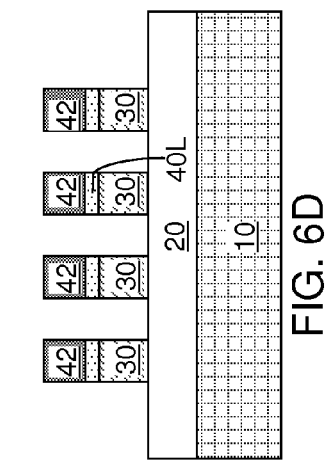
FIG. 6D is a vertical cross-sectional view of the exemplary semiconductor structure along the vertical plane D-D' of FIG. 6A.

Referring to FIGS. 6A, 6B, 6C, and 6D, physically exposed portions of the semiconductor material portion 30P are etched, for example, by an anisotropic etch such as a reactive ion etch, employing a combination of the disposable template layer 60 and the plurality of fin-defining mask structures 42 as an etch mask. A contiguous semiconductor portion is formed on the buried insulator layer 20. The contiguous semiconductor portion has a same thickness throughout, and includes a first pad portion 30P1, a second pad portion 30P2 laterally spaced from the first pad portion 30P1, and a plurality of semiconductor fins 30 connecting the first pad portion 30P1 and the second pad portion 30P2.

The plurality of semiconductor fins 30 are formed by transfer of the pattern of the plurality of fin-defining mask structures 42 underneath the gate cavity 59 into the semiconductor material portion 30P. The area of the plurality of semiconductor fins 30 is the intersection of the area of the plurality of fin-defining mask structures 42 and the area of the gate cavity 59 (which is the same as the area of the disposable gate structure 51).

The remaining portion of the semiconductor material portion 30P constitutes a fin-containing semiconductor portion (30, 30P1, 30P2). The fin-containing semiconductor portion 30 can include a plurality of semiconductor fins 30, a first pad portion (30P1, 30P2), and a second pad portion (30P2, 30D2). Each semiconductor fin 30 among the plurality of semiconductor fins 30 is laterally spaced from each other or one another along a widthwise direction, which is perpendicular to the lengthwise direction of the plurality of semiconductor fins 30. The lengthwise direction of the plurality of semiconductor fins 30 is the same as the lengthwise direction of the plurality of fin-defining mask structures 42.

In one embodiment, the first pad portion 30P1 can have a rectangular shape, and the second pad portion 30P2 can also have a rectangular shape. A lengthwise end of each of the plurality of semiconductor fins 30 is adjoined to the first pad portion 30P1, and another lengthwise end of each of the plurality of semiconductor fins 30 is adjoined to the second pad portion 30P2. The fin-containing semiconductor portion (30, 30P1, 30P2) can have the same height throughout the entirety thereof.

In one embodiment, a plurality of fin-defining mask structures 42 overlies the plurality of semiconductor fins 30, and the plurality of semiconductor fins 30 has a same width as the plurality of fin-defining mask structures 42.

Referring to FIGS. 7A, 7B, 7C, and 7D, physically exposed portions of the plurality fin-defining mask structures 42 within the gate cavity 59 can be removed selective to the plurality of semiconductor fins 30 by an etch, which can be an anisotropic etch or an isotropic etch. The remaining portions of the plurality of fin-defining mask structures 42 overlying the first pad portion 30P1 are herein referred to as first residual mask structures 42S, and the remaining portions of the plurality of fin-defining mask structures 42 overlying the second pad portion 30P2 are herein referred to as second residual mask structures 42D.

Further, the portions of the optional dielectric pad layer 40L within the gate cavity 59 can be removed selective to the plurality of semiconductor fins 30 by another etch, which can be an anisotropic etch or an isotropic etch. The remaining portion of the optional dielectric pad layer 40L overlying the first pad portion 30P1 is herein referred to as a first optional dielectric pad portion 40S. The remaining portion of the optional dielectric pad layer 40L overlying the second pad portion 30P2 is herein referred to as a second optional dielectric pad portion 40D.

Referring to FIGS. 8A, 8B, 8C, and 8D, a gate spacer 56 can be formed on sidewalls of the disposable template layer 60 and on end portions of the plurality of semiconductor fins 30. In order to form the gate spacer 56, a conformal dielectric material layer (not shown) can be deposited on the physically exposed surfaces of the disposable template layer 60 and the plurality of semiconductor fins 30, for example, by chemical vapor deposition (CVD) or atomic layer deposition (ALD). The conformal dielectric material layer includes a dielectric material such as silicon nitride, silicon oxide, a dielectric metal oxide, or a combination thereof. The thickness of the conformal dielectric material layer can be from 3 nm to 100 nm, although lesser and greater thicknesses can also be employed provided that the thickness of the conformal dielectric material layer is less than one half of the width of the gate trench 59 at the processing steps of FIGS. 7A, 7B, 7C, and 7D. The dielectric material of the conformal dielectric material layer may, or may not be, the same as the dielectric material of the plurality of fin-defining mask structures 42.

Vertical portions of the conformal dielectric material layer are subsequently etched by an anisotropic etch to form the gate spacer 56. The anisotropic etch that forms the gate spacer 56 can be selective to the semiconductor material of the plurality of semiconductor fins 30. In one embodiment, the optional dielectric pad layer 40L may not be removed at the processing steps of FIGS. 7A, 7B, 7C, and 7D, can may be employed as an etch stop layer during the anisotropic etch that forms the gate spacer. In this case, the remaining portions of the optional dielectric pad layer 40L that are present between portions of the gate spacer 56 and over the plurality of semiconductor fins 30 may, or may not, be removed after formation of the gate spacer 56.

Referring to FIGS. 9A. 9B, 9C, and 9D, a gate dielectric 50 and a gate electrode 52 can be formed within the gate cavity 59. The gate dielectric 50 can be formed directly on each lengthwise sidewall of the plurality of semiconductor fins 30. The gate dielectric 50 can be formed as a single contiguous layer, for example, by deposition of a dielectric material by chemical vapor deposition (CVD) or atomic layer deposition (ALD), or can be formed by a set of non-contiguous material portions that are formed only on lengthwise sidewalls of the plurality of semiconductor fins 30, for example, by conversion of surface portions of the semiconductor material of the plurality of semiconductor fins 30 into a dielectric material such as silicon oxide, silicon nitride, or silicon oxynitride.

The gate electrode 52 can be formed by filling the gate trench 59 with at least one conductive material such as at least one metallic material and/or at least one doped semiconductor material. The gate electrode 52 overlies the plurality of semiconductor fins 42, and is in contact with the gate dielectric 50. The portion of the at least one conductive material above the top surface of the disposable template layer 60 can be removed, for example, by chemical mechanical planarization. The portion of the gate dielectric 50, if formed above the top surface of the disposable template layer 60, may, or may not, be subsequently removed. The stack of the gate dielectric 50 and the gate electrode 52 replaces the disposable gate structure 51, and is therefore referred to as a replacement gate structure. The stack of the gate dielectric 50 and the gate electrode 52 straddles the plurality of semiconductor fins 30. The gate dielectric 50 may include horizontal ledge that contacts the topmost portion of the gate spacer 56. Upper outer sidewalls of an upper portion of the gate dielectric 50 are vertically coincident with outer sidewalls of the gate spacer 56. As used herein, two elements are vertically coincident with each other if the two elements are within a same vertical plane. The gate electrode 52 can have a T-shaped vertical cross-sectional area as illustrated in FIGS. 9B and 9C. A peripheral portion of the gate electrode 52 overlies the gate spacer 56.

Referring to FIGS. 10A, 10B, 10C, and 10D, the disposable template layer 60 is removed selective to the material of the gate electrode 52 and selective to the semiconductor material of the fin-containing semiconductor portion (30, 30P1, 30P2), which is a contiguous semiconductor portion. The removal of the disposable template layer 60 can be performed, for example, by a wet etch that removes the material of the disposable template layer 60 without removing the semiconductor material of the fin-containing semiconductor portion (30, 30P1, 30P2).

If an isotropic etch such as a wet etch is employed to remove the disposable template layer 660, the etch chemistry that removes the disposable template layer 60 may, or may not, be selective to the material of the first residual mask structures 42S and the second residual mask structures 42D and/or the material of the first optional dielectric pad portion 40S and the second optional dielectric pad portion 40D, provided that the etch chemistry is selective to the material of the gate spacer 56. If an anisotropic etch such as a wet etch is employed to remove the disposable template layer 660, the etch chemistry that removes the disposable template layer 60 may, or may not, be selective to the material of the first residual mask structures 42S and the second residual mask structures 42D and/or the material of the first optional dielectric pad portion 40S and the second optional dielectric pad portion 40D.

In one embodiment, if the disposable template layer 60 includes organosilicate glass, the disposable template layer 60 can be removed selective to silicon nitride, dielectric metal oxides, semiconductor materials, and metallic materials, by a wet etch employing dilute hydrofluoric acid, which etches organosilicate glass at a faster (by at least one order of magnitude) etch rate than silicon oxide. In another embodiment, if the disposable template layer 60 includes silicon oxide and the gate spacer 56 includes silicon nitride, the disposable template layer 60 can be removed by a wet etch employing hydrofluoric acid. In yet another embodiment, if the disposable template layer 60 includes silicon nitride and the gate spacer 56 includes silicon oxide, the disposable template layer 60 can be removed by a wet etch employing hot phosphoric acid.

Figure 11B:
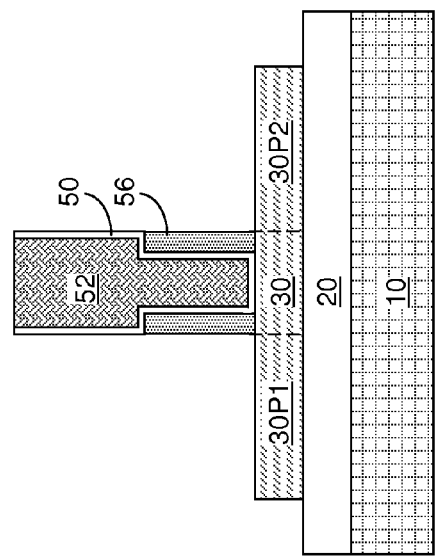
FIG. 11B is a vertical cross-sectional view of the exemplary semiconductor structure along the vertical plane B-B' of FIG. 11A.
Figure 11C:
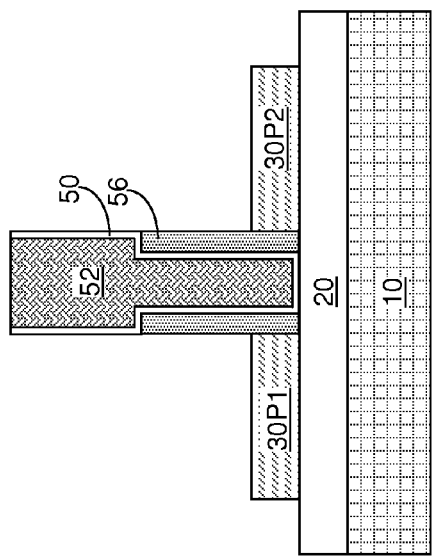
FIG. 11C is a vertical cross-sectional view of the exemplary semiconductor structure along the vertical plane C-C' of FIG. 11A.
Figure 11A:
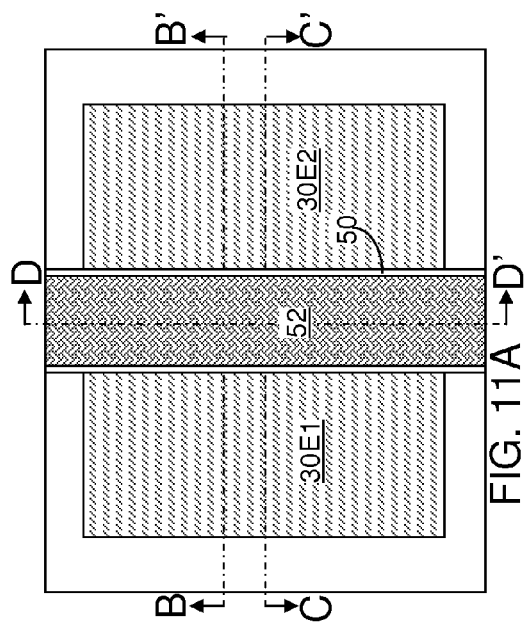
FIG. 11A is a top-down view of the exemplary semiconductor structure after removal of remaining portions of the plurality of fin-defining mask structures according to an embodiment of the present disclosure.
Figure 11D:
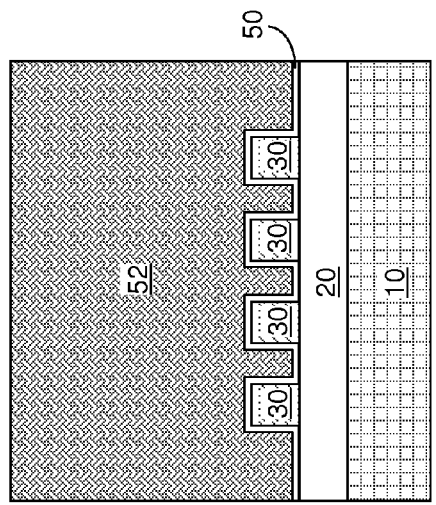
FIG. 11D is a vertical cross-sectional view of the exemplary semiconductor structure along the vertical plane D-D' of FIG. 11A.

Referring to FIGS. 11A, 11B, 11C, and 11D, any remaining portion of the first residual mask structures 42S, the second residual mask structures 42D, the first optional dielectric pad portion 40S, and the second optional dielectric pad portion 40D are removed selective to the gate spacer 56, the fin-containing semiconductor portion (30, 30P1, 30P2), and the gate electrode 52. In one embodiment, the gate dielectric 50 may be intact throughout the etch processes employed to remove the disposable template layer 60, the first residual mask structures 42S, the second residual mask structures 42D, the first optional dielectric pad portion 40S, and the second optional dielectric pad portion 40D. In another embodiment, the physically exposed portions of the gate dielectric located above the plane of the topmost surface of the gate spacer 56 may be thinned or removed during the etch processes employed to remove the disposable template layer 60, the first residual mask structures 42S, the second residual mask structures 42D, the first optional dielectric pad portion 40S, and the second optional dielectric pad portion 40D.

Figure 12B:
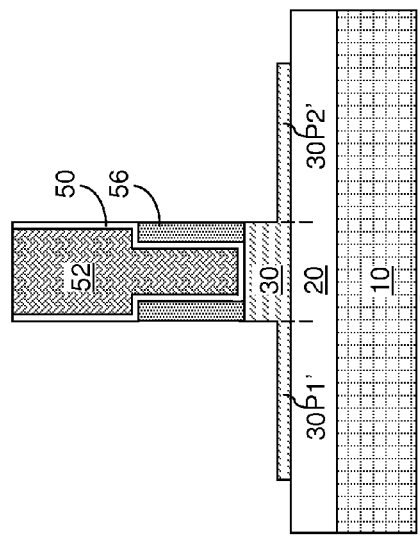
FIG. 12B is a vertical cross-sectional view of the exemplary semiconductor structure along the vertical plane B-B' of FIG. 12A.
Figure 12C:
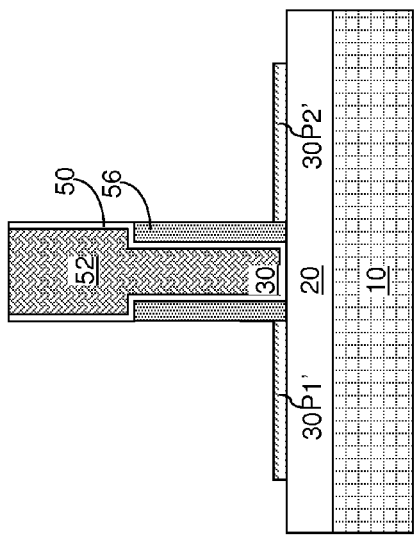
FIG. 12C is a vertical cross-sectional view of the exemplary semiconductor structure along the vertical plane C-C' of FIG. 12A.
Figure 12A:
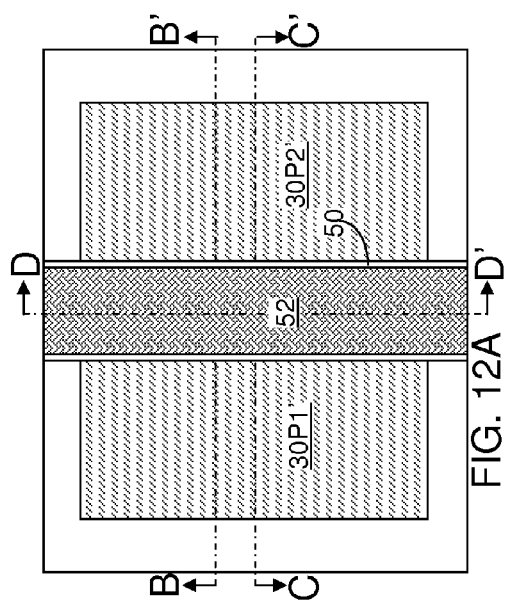
FIG. 12A is a top-down view of the exemplary semiconductor structure after vertically recessing a first pad portion and a second pad portion of the semiconductor material portion below horizontal top surfaces of the plurality of semiconductor fins employing the replacement gate stack as an etch mask according to an embodiment of the present disclosure.
Figure 12D:
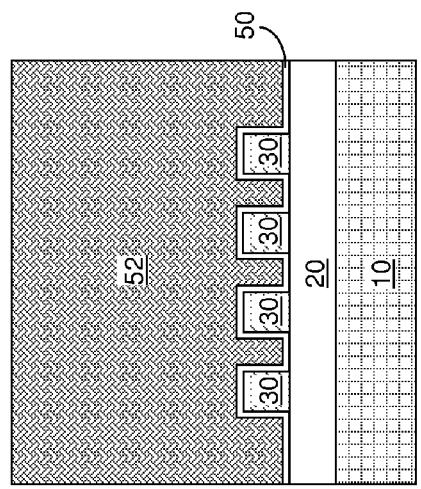
FIG. 12D is a vertical cross-sectional view of the exemplary semiconductor structure along the vertical plane D-D' of FIG. 12A.

Referring to FIGS. 12A, 12B, 12C, and 12D, top surfaces of the first pad portion 30P1 and the second pad portion 30P2 of the fin-containing semiconductor portion (30, 30P1, 30P2) are vertically recessed below horizontal top surfaces of the plurality of semiconductor fins 30 employing the replacement gate stack (50, 52) as an etch mask. The vertical recessing of the top surfaces of the first pad portion 30P1 and the second pad portion 30P2 can be performed by an anisotropic etch such as a reactive ion etch. The remaining portion of the first pad portion 30P1 after the vertical recessing is herein referred to as a recessed first pad portion 30P1', and the remaining portion of the second pad portion 30P2 after the vertical recessing is herein referred to as a recessed second pad portion 30P2'. First vertical end walls of the plurality of semiconductor fins 30 are vertically coincident with an outer sidewall of the gate spacer 56 and adjoin the top surface of the recessed first pad portion 30P1'. Second vertical end walls of the plurality of semiconductor fins 30 are vertically coincident with another outer sidewall of the gate spacer 56 and adjoin the top surface of the recessed second pad portion 30P2'.

After the vertical recess, the fin-containing semiconductor portion (30, 30P1', 30P2') include the plurality of semiconductor fins 30, the recessed first end portion 30P1', and the recessed second end portion 30P2'. The thickness of the recessed first pad portion 30P1' and the recessed second pad portion 30P2' can be, for example, from 1% to 80% of the height of the plurality of semiconductor fins. In one embodiment, the thickness of the recessed first pad portion 30P1' and the recessed second pad portion 30P2' can be selected to be thin enough to enable subsequent formation of vertical source junctions and vertical drain junctions by ion implantation or plasma doping. For example, the thickness of the recessed first pad portion 30P1' and the recessed second pad portion 30P2' can be from 1 nm to 50 nm. The conductivity of the doping of the fin-containing semiconductor portion (30, 30P1', 30P2') is herein referred to as a first conductivity type.

Referring to FIG. 13, a source region 44 and a drain region 46 are formed by introducing electrical dopants of a second conductivity type into the recessed first pad portion 30P1', the recessed second pad portion 30P2', and end portions of the plurality of semiconductor fins 30, for example, by ion implantation and/or plasma doping. The second conductivity type is the opposite of the first conductivity type. For example, if the first conductivity type is p-type, the second conductivity type is n-type, and vice versa. The portions of the plurality of semiconductor fins 30 into which the second conductivity type dopants are not introduced are herein referred to as body regions 45.

Source junctions are formed between the source region 44 and the body regions 45 by introducing electrical dopants of the second conductivity type through the top surface of the recessed first pad portion 30P1' and through the first vertical end walls of the plurality of semiconductor fins 30, for example, by angled ion implantation or by plasma doping. Drain junctions are formed between the drain region 46 and the body region 45 by introducing electrical dopants of the second conductivity type through the top surface of the recessed second pad portion 30P2' and through the second vertical end walls of the plurality of semiconductor fins 30, for example, by angled ion implantation or by plasma doping. By selecting the thickness of the recessed first pad portion 30P1' and the recessed second pad portion 30P2' to be within a range of from 1 nm to 50 nm, the entirety of the source junctions and the entirety of the drain junctions can be vertical from the top surfaces of the semiconductor fins 30 (See FIG. 12B) to the bottom surfaces of the semiconductor fins 30. Thus, the channel length, i.e., the lateral distance between the source region 44 and the drain region 46, is independent of the height within the entirety of the body regions 50.

The exemplary semiconductor structure includes a first pad portion that is the recessed first pad portion 30P1', and a second pad portion that is the recessed second pad portion 30P2'. The recessed second pad portion 30P2' is spaced from the recessed first pad portion 30P1'. The plurality of semiconductor fins 30 connects the recessed first pad portion 30P1' and the receded second pad portion 30P2'. The plurality of semiconductor fins has a greater thickness than the recessed first pad portion 30P1' and the recessed second pad portion 30P2'. The source region 44 includes the first recessed pad portion 30P1' and first end portions of the plurality of semiconductor fins, and the drain region 46 includes the recessed second pad portion 30P2' and second end portions of the plurality of semiconductor fins. The top surface of the recessed first pad portion 30P1' and the top surface of the receded second pad portion 30P2' are recessed relative to top surfaces of the plurality of semiconductor fins 30'.

The source junctions between the source region 44 and the body regions 45 within the plurality of semiconductor fins are vertical, and the drain junctions between the drain region 46 and the body regions 45 are vertical. The source junctions are vertical between the top surfaces of the plurality of semiconductor fins and a top surface of the buried insulator layer 20, and the drain junctions are vertical between the top surfaces of the plurality of semiconductor fins and the top surface of the buried insulator layer 20. A gate spacer 56 is in contact with the source junctions and with the drain junctions. First vertical end walls of the plurality of semiconductor fins adjoin the recessed top surface of the recessed first pad portion 30P1' and a bottom surface of the gate spacer 56, and second vertical end walls of the plurality of semiconductor fins adjoin the recessed top surface of the recessed second pad portion 30P2' and the bottom surface of the gate spacer 56.

Figure 14A:
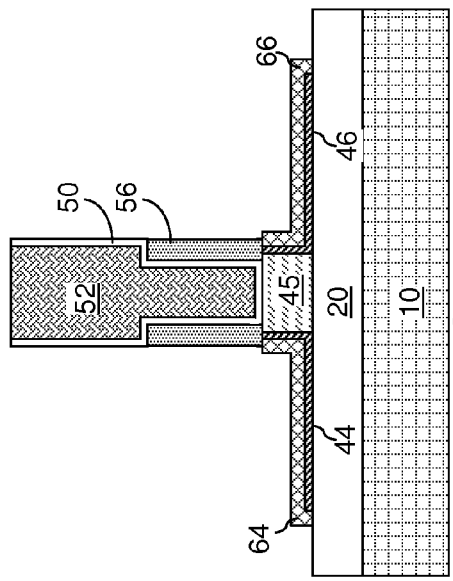
FIG. 14A is a top-down view of the exemplary semiconductor structure after formation of various metal semiconductor alloy regions according to an embodiment of the present disclosure.
Figure 14B:
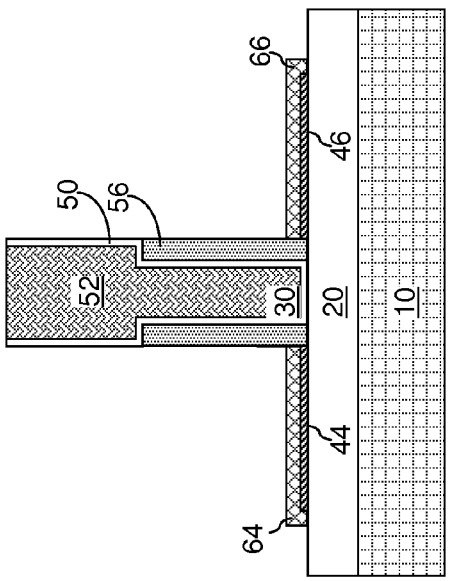
FIG. 14B is a vertical cross-sectional view of the exemplary semiconductor structure along the vertical plane B-B' of FIG. 14A.
Figure 14D:
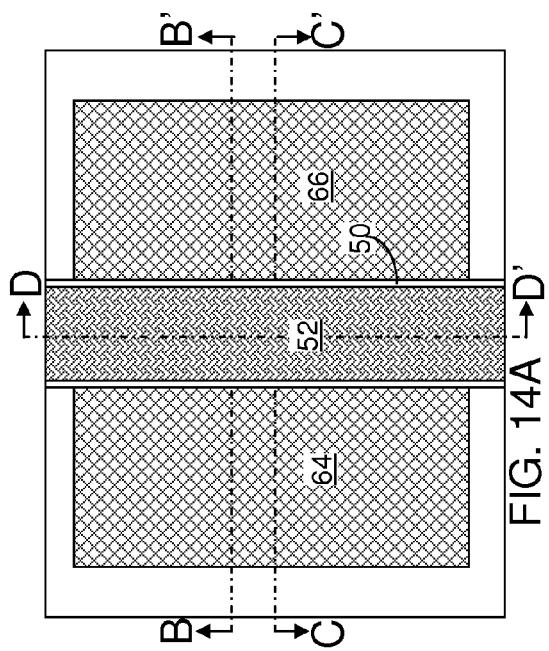
FIG. 14D is a vertical cross-sectional view of the exemplary semiconductor structure along the vertical plane D-D' of FIG. 14A.
Figure 14C:
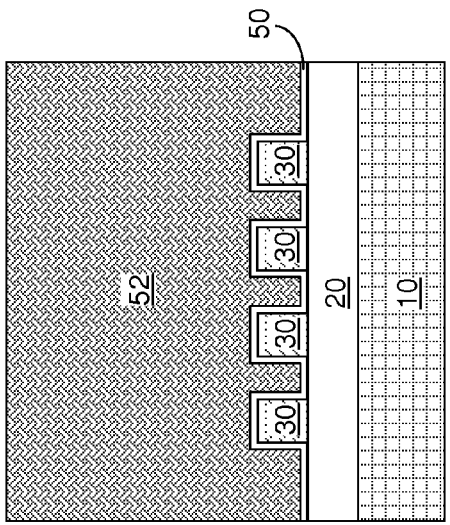
FIG. 14C is a vertical cross-sectional view of the exemplary semiconductor structure along the vertical plane C-C' of FIG. 14A.

Referring to FIGS. 14A, 14B, 14C, and 14D, various metal semiconductor alloy regions can be optionally formed, for example, by depositing a metal layer by physical vapor deposition (PVD) or chemical vapor deposition (CVD), and by reacting the metal layer with the underlying second semiconductor material at an elevated temperature, and subsequently removing unreacted portions of the metal layer. A source-side metal semiconductor alloy portion 64 can be formed directly on the recessed first pad portion 30P1' (See FIG. 13B). The source-side metal semiconductor alloy portion 64 can contact a bottom surface of the gate spacer 56. A drain-side metal semiconductor alloy portion 66 can be formed directly on the recessed second pad portion 30P2'. The drain-side metal semiconductor alloy portion 66 can contact the bottom surface of the gate spacer 56.

In one embodiment, the source-side metal semiconductor alloy portion 64 can contact all of the first vertical end walls of the plurality of semiconductor fins, and the drain-side metal semiconductor alloy portion 66 can contact all of the second vertical end walls of the plurality of semiconductor fins. In one embodiment, a planar top surface of the source-side metal semiconductor alloy portion 64 can extend over the entirety of the recessed first pad portion 30P1' (See FIGS. 13B and 13C), and can be located under the horizontal plane of the interface between the gate dielectric 50 and the plurality of semiconductor fins. A planar top surface of the drain-side metal semiconductor alloy portion 66 can extend over the entirety of the recessed second pad portion 30P2' (See FIGS. 13B and 13C), and can be located under the horizontal plane of the interface between the gate dielectric 50 and the plurality of semiconductor fins. An interface between the source-side metal semiconductor alloy portion 64 and the recessed first pad portion 30P1' can adjoin the bottom surface of the gate spacer 56, and an interface between the drain-side metal semiconductor alloy portion 66 and the recessed second pad portion can adjoin the bottom surface of the gate spacer 56.

Figure 15B:
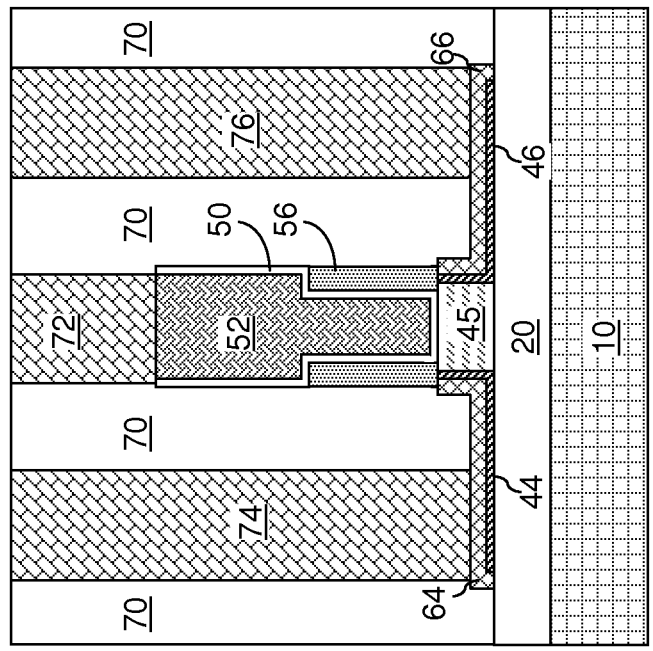
FIG. 15B is a vertical cross-sectional view of the exemplary semiconductor structure along the vertical plane B-B' of FIG. 15A.
Figure 15A:
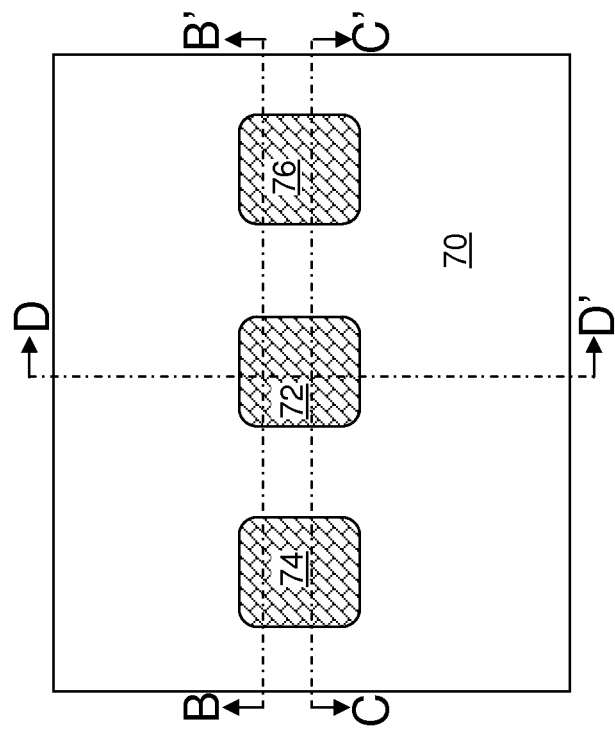
FIG. 15A is a top-down view of the exemplary semiconductor structure after formation of various contact via structures according to an embodiment of the present disclosure.
Figure 15C:
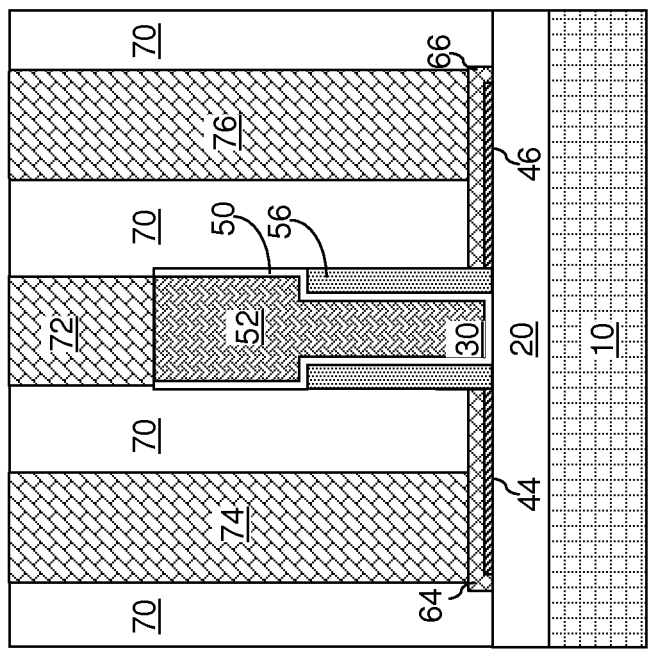
FIG. 15C is a vertical cross-sectional view of the exemplary semiconductor structure along the vertical plane C-C' of FIG. 15A.
Figure 15D:
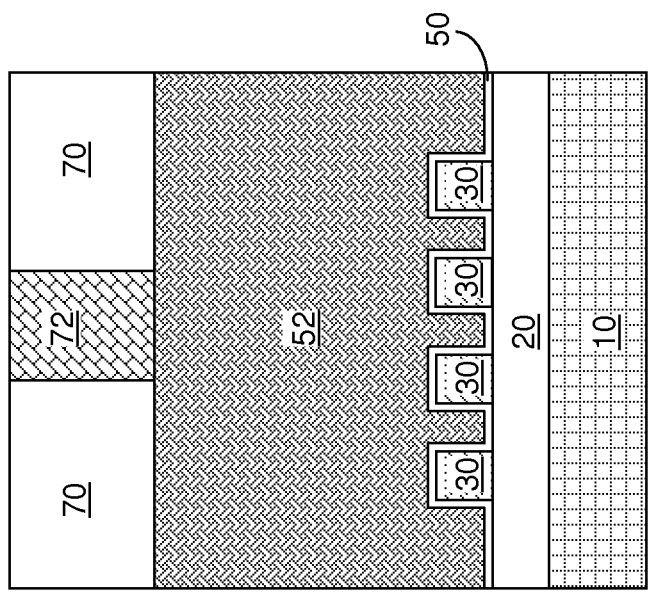
FIG. 15D is a vertical cross-sectional view of the exemplary semiconductor structure along the vertical plane D-D' of FIG. 15A.

Referring to FIGS. 15A, 15B, 15C, and 15D, a contact level dielectric material layer 70 can be formed by depositing a dielectric material, which can include, for example, silicon oxide, silicon nitride, silicon oxynitride, and/or porous or non-porous organosilicate glass (OSG). Various contact via structures can be formed to provide electrical contact with various components of a fin field effect transistor, which includes a plurality of channels within the plurality of semiconductor fins. The various contact via structures can include, for example, a gate contact via structure 72 that contacts the gate electrode 52, a source contact via structure 74 that contacts the source-side metal semiconductor alloy portion 64, and a drain contact via structure 76 that contacts the drain-side metal semiconductor alloy portion 66.

The vertical source junction and the vertical drain junction in each of the plurality of semiconductor fins provide a uniform channel length that is independent of the height within the plurality of semiconductor fins. Thus, device characteristics of the field effect transistor such as the off-current and the threshold voltage can be well defined with minimal variations.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a contiguous semiconductor portion located on an insulator layer, said contiguous semiconductor portion including:
        a first pad portion;
        a second pad portion spaced from said first pad portion;
        a plurality of semiconductor fins connecting said first pad portion and said second pad portion,
        wherein a source region includes said first pad portion and first end portions of said plurality of semiconductor fins, and a drain region includes said second pad portion and second end portions of said plurality of semiconductor fins,
        wherein a top surface of said first pad portion and a top surface of said second pad portion are recessed relative to top surfaces of said plurality of semiconductor fins, and
        wherein source junctions between said source region and body regions within said plurality of semiconductor fins are vertical, and drain junctions between said drain region and said body regions are vertical;
    a gate structure straddling each semiconductor fin of said plurality of semiconductor fins, wherein said gate structure comprising a gate dielectric and a gate electrode, said gate dielectric is present on sidewall surfaces of said gate electrode and beneath a bottommost surface of said gate electrode and has an uppermost surface that is coplanar with an uppermost surface of said gate electrode;
    a gate spacer in contact with said source junctions and with said drain junctions;
    a source-side metal semiconductor alloy portion in contact with said first pad portion, a vertical sidewall of said source junctions, and said gate spacer; and
    a drain-side metal semiconductor alloy portion in contact with said second pad portion, a vertical sidewall of said drain junctions, and said gate spacer.

2. The semiconductor structure of claim 1, wherein said source junctions are vertical between said top surfaces of said plurality of semiconductor fins and a top surface of said insulator layer, and said drain junctions are vertical between said top surfaces of said plurality of semiconductor fins and said top surface of said insulator layer.

3. The semiconductor structure of claim 1, wherein first vertical end walls of said plurality of semiconductor fins adjoin said recessed top surface of said first pad portion and a bottom surface of said gate spacer, and second vertical end walls of said plurality of semiconductor fins adjoin said recessed top surface of said second pad portion and said bottom surface of said gate spacer.

4. The semiconductor structure of claim 3, wherein said source-side metal semiconductor alloy portion contacts all of said first vertical end walls, and said drain-side metal semiconductor alloy portion contacts all of said second vertical end walls.

5. The semiconductor structure of claim 3, wherein a planar top surface of said source-side metal semiconductor alloy portion extends over an entirety of said first pad portion, and is located under a horizontal plane of an interface between a gate dielectric and said plurality of semiconductor fins, and a planar top surface of said drain-side metal semiconductor alloy portion extends over an entirety of said second pad portion, and is located under said horizontal plane.

6. The semiconductor structure of claim 3, wherein an interface between said source-side metal semiconductor alloy portion and said first pad portion adjoins said bottom surface of said gate spacer, and an interface between said drain-side metal semiconductor alloy portion and said second pad portion adjoins said bottom surface of said gate spacer.

7. The semiconductor structure of claim 1, wherein outer sidewalls of an upper portion of said gate dielectric are vertically coincident with outer sidewalls of said gate spacer.

8. The semiconductor structure of claim 7, wherein a peripheral portion of said gate electrode overlies said gate spacer.

9. The semiconductor structure of claim 1, wherein said first pad portion and said second pad portion are rectangular.

10. The semiconductor structure of claim 1, wherein a first lengthwise end of each semiconductor fin is adjoined to said first pad portion and wherein a second length edge of each semiconductor fin is adjoined to said second pad portion.

11. The semiconductor structure of claim 1, wherein said gate electrode is T-shape and comprises a lower portion having a first width and an upper portion having a second width that is greater than the first width.

12. The semiconductor structure of claim 1, wherein a portion of said gate structure is present on a topmost surface of said insulator layer.

13. The semiconductor structure of claim 1, wherein said insulator layer is entirely planar.

14. The semiconductor structure of claim 1, further comprising a contact level dielectric material layer surrounding said plurality of semiconductor fins and said gate structure.

15. The semiconductor structure of claim 14, wherein said contact level dielectric material layer comprises a gate contact via structure in direct contact with said uppermost surface of the gate electrode, a source contact via structure in direct contact with said source region, and a drain contact via structure in direct contact with said drain region.

16. The semiconductor structure of claim 14, wherein said uppermost surface of said gate electrode is located beneath an uppermost surface of said contact level dielectric material layer.

\* \* \* \* \*